(12) United States Patent
Rigolle et al.

(10) Patent No.: US 8,243,037 B2
(45) Date of Patent: Aug. 14, 2012

(54) SYSTEM AND A METHOD FOR PROCESSING A SIGNAL FROM AN ELECTRIC DEVICE

(75) Inventors: Thibaut Rigolle, Forli (IT); Mario Barocci, Cesena (IT); Laurent Jeanneteau, Compeigne (FR)

(73) Assignee: Electrolux Home Products Corporation, N.V., Zaventem (BE)

( * ) Notice: Subject to any disclaimer, the term of this patent is extended or adjusted under 35 U.S.C. 154(b) by 264 days.

(21) Appl. No.: 12/667,317

(22) PCT Filed: Jul. 1, 2008

(86) PCT No.: PCT/EP2008/005359
§ 371 (c)(1),
(2), (4) Date: Mar. 29, 2010

(87) PCT Pub. No.: WO2009/007041
PCT Pub. Date: Jan. 15, 2009

(65) Prior Publication Data
US 2010/0207896 A1      Aug. 19, 2010

(30) Foreign Application Priority Data

Jul. 11, 2007    (EP) ................................. 07013564

(51) Int. Cl.
*G06F 3/041* (2006.01)
(52) U.S. Cl. ........................................ 345/173; 700/33
(58) Field of Classification Search .......... 345/156–179; 178/18.01–18.09, 18.11, 19.01–19.07; 240/679; 700/33, 34; 340/679
See application file for complete search history.

(56) References Cited

U.S. PATENT DOCUMENTS

| | | | | |
|---|---|---|---|---|
| 3,584,203 A | * | 6/1971 | Patzelt et al. | ................... 700/33 |
| 4,442,495 A | | 4/1984 | Sukonick | |
| 4,866,363 A | * | 9/1989 | Patton et al. | ................... 318/663 |
| 5,854,744 A | * | 12/1998 | Zeng et al. | ....................... 700/34 |
| 5,880,538 A | | 3/1999 | Schulz | |

FOREIGN PATENT DOCUMENTS

| | | |
|---|---|---|
| EP | 0121212 A | 10/1984 |
| EP | 0308840 A | 3/1989 |
| EP | 0816957 A | 1/1998 |

* cited by examiner

*Primary Examiner* — Stephen Sherman
(74) *Attorney, Agent, or Firm* — Workman Nydegger

(57) ABSTRACT

The present invention relates to a system for processing a signal from an electric device, e.g. a touch sensitive key. The system comprises a reference value for the signal, wherein said reference value is continuously updated, and an arithmetic unit for determining a difference value between the signal and the reference value, so that difference value corresponds with a change of the signal. The system comprises further a spectrum of the possible difference values, wherein said spectrum is subdivided into ranges corresponding with possible causations for the change of the signal in said system. Additionally, the system comprises a comparing unit for associating the difference value with the corresponding range of the spectrum and for identifying, if the difference value results from a disturbance or from a relevant change in the electric device. Further, the present invention relates to a corresponding method.

11 Claims, 1 Drawing Sheet

SYSTEM AND A METHOD FOR PROCESSING A SIGNAL FROM AN ELECTRIC DEVICE

BACKGROUND OF THE INVENTION

1. Field of the Invention

The present invention relates to a system for processing a signal from an electric device according to claim 1. Further, the present invention relates to a method for processing a signal from an electric device according to claim 10.

2. Background and Relevant Art

Signals from electric devices represent or describe a certain state or an arbitrary analogue value. The information contained in said signals is used to control an apparatus or a process, for example. The signal may be a direct current (DC voltage) voltage signal. Usually, the value of the voltage characterizes the state of the device or the value of a quantity.

The electric device may be a manual or an automatic switch. If the state of the switch is changed, then also the signal transmitted by said switch is changed. Further, the electric device may be a sensor element for detecting physical quantities, like temperature, pressure and humidity. The signal from the electric device represents the value of the detected quantity.

In some of the above electric devices, a change of the state or the detected quantity may result in a relative small change of the signal. A change of the signals may be also caused by disturbances of the electric device or the system.

Therefore, the system has to distinguish, if the signal is disturbed or if

BRIEF SUMMARY OF THE INVENTION the change of the signal bases on a real change of the state or detected value.

It is an object of the present invention to provide a system and a method for processing a signal from an electric device, which is able to recognize disturbances.

This object is achieved by the system according to claim 1.

According to the present invention the system for processing a signal from an electric device comprises:

- a reference value for the signal, wherein said reference value is continuously updated after a first measurement,
- an arithmetic unit for determining a difference value between the signal and the reference value, so that difference value corresponds with a change of the signal,
- a spectrum of the possible difference values, wherein said spectrum is subdivided into ranges corresponding with possible causations for the change of the signal in said system, and
- a comparing unit for associating the difference value with the corresponding range of the spectrum and for identifying, if the difference value results from a disturbance or from a relevant change in the electric device.

The main idea of the invention is the on one hand, that the reference value is continuously adapted, and on the other hand, that the complete spectrum of all possible difference values is subdivided into ranges. Said ranges correspond with the possible kinds of the causations for the disturbances. The continuous adapting allows that the reference value is always actualized.

The continuous adapting avoids that two or more disturbances within a small time are identified as a change of the state or value in the electric device. When a change of the signal occurs, the system recognizes, if said change is caused by a disturbance or by relevant change of the state or value. Further, the ranges allow, that the system recognizes, what kind of disturbance occurs. In a preferred embodiment of the present invention the spectrum includes all of the possible positive and negative difference values in view of the electric device. This allows identifying positive and negative changes of the signal.

In particular, the reference value is continuously adapted to an actual value of the signal. This fast adaptation avoids that two or more disturbances are identified as change of the signal. For example, this behavior may be used to detect a slow approach of a finger.

For example, the signal is an analogue signal. Preferably, the signal is a direct current voltage (DC Voltage) signal. The signal may be characterized by its voltage. Alternatively, the frequency of an alternating current and other characteristic quantities may also be used as the signal.

Preferably, at least one of the ranges corresponds with temperature fluctuations. The temperature fluctuations disturb the electric device. The corresponding range allows identifying such temperature fluctuations.

Further, at least one of the ranges corresponds with noise, detection failures and/or hysteresis effects, respectively.

In particular, at least one of the ranges corresponds with at least one of the relevant changes in the electric device. Thus, the system is able to distinguish between changes caused by disturbances and such changes caused by relevant changes in the electric device.

For example, the electric device is a switch. In particular, the electric device is a touch sensitive key. The touch sensitive key provides relative small changes of the signal and the system is able to identify relevant signals.

Further, the electric device may be a variable electric or electronic element, like a potentiometer or a DC variation.

According to another application, the electric device may be a sensor for detecting at least one physical quantity. Also in this case relative small changes of the signal occur.

The system may be realized in hardware, software or a combination of hardware and software.

Additionally the present invention relates to a computer program product stored on a computer usable medium, comprising computer readable program means for causing a computer to realize the above described system.

The object of the present invention is also achieved by a method according to claim 10.

According to the present invention the method for processing a signal from an electric device comprises the following steps:

- setting a reference value, in particular by taking into account the precedent signal,
- receiving the signal from the electric device,
- determining a difference value between the signal and the reference value,
- providing a spectrum of the possible difference values, wherein said spectrum is subdivided into ranges corresponding with possible causations for the change of the signal in electric device,
- comparing the difference value with the spectrum,
- associating the difference value with the corresponding range of the spectrum,
- identifying, if the difference value results from a disturbance or from a relevant change in the electric device, and
- updating the reference value.

The inventive method actualizes continuously the reference value on the one hand and uses the complete spectrum of all possible difference values. Said spectrum is subdivided into ranges, which correspond with the possible kinds of the causations for the disturbances. The continuous adapting allows that the reference value is always actualized.

The continuous adapting avoids that two or more disturbances within a relative small time are identified as a change of the value or the state in the electric device. When a change of the signal occurs, it is recognized, if said change is caused by a disturbance or by a relevant change of the state or value. Further, the ranges allow, that by the inventive method can be recognized, what kind of disturbance occurs.

In a preferred embodiment of the present invention the used spectrum includes all of the positive and negative difference values in view of the electric device.

In particular, the reference value is continuously adapted to an actual value of the signal. Such a fast adaptation avoids that two or more disturbances are identified as change of the signal.

Preferably, the received signal is an analogue signal and/or a direct current voltage (DC Voltage) signal. The received signal may be characterized by its voltage. Alternatively, the frequency of an alternating current and other characteristic quantities may also be used as the signal.

For example, the signal is received from a switch. In particular, the signal is received from a touch sensitive key. The touch sensitive key provides relative small changes of the signal. With the inventive method the relevant signals may be distinguished from disturbances.

The signal is received from a variable electric or electronic element and/or from a sensor for detecting at least one physical quantity. The method according to the present invention may be realized in hardware, software or a combination of hardware and software.

At last, a computer program product is provided. Said computer program product is stored on a computer usable medium, comprising computer readable program means for causing a computer to perform the method described above.

The novel and inventive features believed to be the characteristic of the present invention are set forth in the appended claims.

BRIEF DESCRIPTION OF THE DRAWINGS

The invention will be described in further detail with reference to the drawing, in which.

DETAILED DESCRIPTION OF THE PREFERRED EMBODIMENTS

Figure 1:
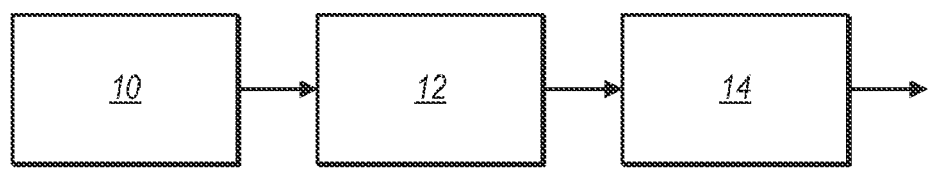
FIG. 1 illustrates a schematic block diagram of a system for processing a signal according to a preferred embodiment of the invention.

FIG. 1 illustrates a schematic block diagram of a system for processing a signal according to a preferred embodiment of the invention. The system includes an electric device 10, a detection circuit 12 and a processing unit 14. The electric device 10 provides a signal U. Generally, this signal can be a voltage, a current, a capacitive, an impedance and so on. The detection circuit 12 receives the signal U from the electric device 10. The detection circuit 12 modifies, corrects and/or amplifies the signal U. The processing unit 14 processes the signal U in order to identify the state, request and/or value corresponding with the signal U. The electric device 10 may include electrical and/or mechanical elements. For example, the electric device 10 comprises one or more sensors for detecting physical quantities, like temperature, pressure, brightness, weight and so on. Further, the electric device 10 may be a manual switch. In a special embodiment of the present invention the electric device 10 is a touch sensitive key. In general, the electric device 10 may be an arbitrary device, which provides the signal U describing a state and/or a value. In particular, the signal U is formed as an analogous voltage signal.

The detection circuit 12 is preferably an electric circuit. The detection circuit 12 receives the signal U from the electric device 10. For example, the detection circuit 12 modifies, corrects, amplifies and/or filters the signal U.

The processing unit 14 receives the signal U from the detection circuit 12. The processing unit 14 compares the received signal U with a reference value $U_{ref}$. In particular, the received signal U is continuously compared with the reference value $U_{ref}$. Then, the processing unit 14 determines a difference value $\Delta U$ between the signal U and the reference value $U_{ref}$.

The processing unit 14 comprise a spectrum of the possible difference values $\Delta U$. The spectrum includes positive difference values $\Delta U$ as well as negative difference values $\Delta U$. The spectrum is adapted to the electric device 10. Further, the spectrum may be adapted to the detection circuit 12. The spectrum is subdivided into ranges. Each of the ranges corresponds with a certain causation of the change of the received signal U. Comparing the change of the signal U with the spectrum the processing unit 14 is able to recognize the causation of said change. In particular, the processing unit 14 can recognize, if the change of the signal U is caused by a disturbance or real change of the state or the detected quantity in the electric device 10.

The reference value $U_{ref}$ is continuously updated, so that the actual difference value $\Delta U$ is effectively the change of the signal U. The continuous updating of the reference value $U_{ref}$ avoids that two or more disturbances within a short time are misleadingly identified as a real change of the state or value in the electric device 10.

Figure 2:
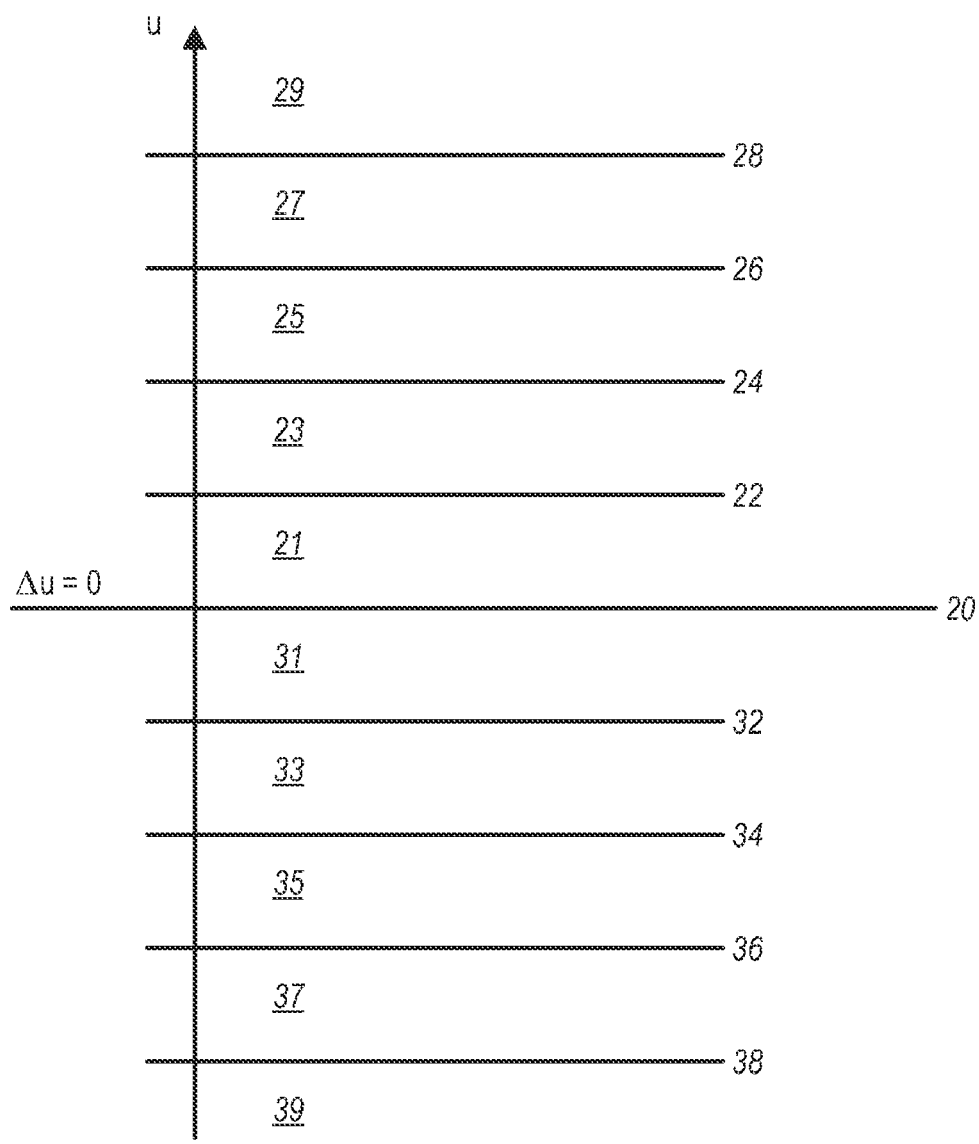
FIG. 2 illustrates a schematic diagram of a spectrum of possible difference values in the system according to the preferred embodiment of the invention.

FIG. 2 illustrates a schematic diagram of a spectrum of possible difference values $\Delta U$ in the system according to the preferred embodiment of the invention. The spectrum is subdivided into several ranges. In this example the spectrum includes ten ranges limited by corresponding limit values.

A zero point 20 corresponds with the difference value $\Delta U = 0$. A first positive range 21 extends between the zero point 20 and a first positive limit value 22. A first negative range 31 extends between the zero point 20 and a first negative limit value 32. A second positive range 23 extends between the first positive limit value 22 and a second positive limit value 24. A second negative range 33 extends between the first negative limit value 32 and a second negative limit value 34.

A third positive range 25 extends between the second positive limit value 24 and a third positive limit value 26. A third negative range 35 extends between the second negative limit value 34 and a third negative limit value 36. A fourth positive range 27 extends between the third positive limit value 26 and a fourth positive limit value 28. A fourth negative range 37 extends between the third negative limit value 36 and a fourth negative limit value 38.

A fifth positive range 29 extends from the fourth positive limit value 28 up to arbitrary high positive values. A fifth negative range 39 extends from the fourth negative limit value 38 up to arbitrary low negative values.

The above different ranges correspond with different causations of the changes of the signal U.

In this example the difference values $\Delta U$ within the first positive range 21 and the first negative range 31 are caused by thermal fluctuations. The thermal fluctuations disturb the electric device 10 and/or the detection circuit 12 and result in a change of the signal U.

Further, the difference values ΔU within the second positive range 23 and the second negative range 33 in this example are caused by the noise. The noise occurs in electric circuits, in particular in the detection circuit 12 and also in the electric device 10. The noise also results in a change of the signal U.

The difference values ΔU within the fourth positive range 27 and the fourth negative range 37 are the result of the hysteresis in order to avoid a rebounce effect. If the precedent signal was detected in the fifth range, the fourth range will act as the fifth range. If the precedent signal was detected in the third range, the fourth range will act as the third range.

The difference values ΔU within the fifth positive range 29 and the fifth negative range 39 are caused by real changes in the electric device 10. Said real changes may be the handling of a switch or the change of a detected physical quantity.

In particular, the electric device 10 is a touch sensitive key. If the touch sensitive key is touched by the user, then a relative small change of the signal U from said touch sensitive key occurs. However, the change of the signal U after the touch is bigger than the change caused by a disturbance. Since the reference value $U_{ref}$ is continuously updated, two or more disturbances within a short time cannot be identified as a touch of the key.

The inventive system and method can be used with various electric devices 10 and/or detection circuits 12. The inventive system and method are adaptable to those voltages, which correspond with the different states of the electric devices 10 and/or detection circuits 12. The present invention can also be embedded in a computer program product, which comprises all the features enabling the implementation of the method described herein. Further, when loaded in a computer system, said computer program product is able to carry out these methods.

Although illustrative embodiments of the present invention have been described herein with reference to the accompanying drawing, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

REFERENCE NUMERALS 10 sensor device
12 detection circuit 14 processing unit
20 zero point
21 first positive range
22 first positive limit value
23 second positive range 24 second positive limit value
25 third positive range
26 third positive limit value
27 fourth positive range
28 fourth positive limit value 29 last positive range
31 first negative range
32 first negative limit value
33 second negative range
34 second negative limit value 35 third negative range
36 third negative limit value
37 fourth negative range
38 fourth negative limit value
39 last negative range
U signal
$U_{ref}$ reference value
ΔU difference value

We claim:

1. A system for processing a signal from an electric device, wherein said system comprises:
   one or more computer storage devices for storing:
      a reference value for the signal, wherein said reference value is continuously updated and adapted to an actual value of the signal;
      a spectrum of possible difference values, wherein:
         said spectrum is subdivided into ranges corresponding with possible causes for a change of the signal in the system;
         at least one range corresponds with temperature fluctuations;
         at least one range corresponds with noise;
         at least one range corresponds with hysteresis effects; and
         at least one range corresponds with at least one of the relevant changes in the electronic device; and
   one or processing units programmed to:
      determine a difference value between the signal and the reference value, so that difference value corresponds with a change of the signal;
      associate the difference value with the corresponding range of the spectrum; and
      identify if the difference value results from a disturbance or from a relevant change in the electric device;
   wherein:
      the spectrum includes all of the possible positive and negative difference values in view of the electric device for identifying positive and negative changes of the signal;
      each of the ranges corresponds with a certain causation of the changes of the received signal; and
      by comparing the change of the signal with the spectrum by the one or more processing units the causation of said change is recognizable.

2. The system according to claim 1, further comprising a detection circuit for receiving the signal from the electronic device.

3. The system according to claim 2, wherein the detection circuit is configured to modify, correct, or amplify the signal received from the electronic device.

4. The system according to claim 1, wherein the signal is an analogue signal.

5. The system according to claim 1, wherein the signal is a direct current voltage signal or the signal is characterized by its voltage.

6. The system according to claim 1, wherein the electric device is a switch or a touch sensitive key or a variable electric, electronic or mechanical element or a sensor for detecting at least one physical quantity.

7. The system according to claim 6, wherein the electronic device is a touch sensitive key.

8. A computer program storage device having computer-executable instructions stored thereon that, when executed cause one or more processing units in a computer system to perform a method of processing a signal from touch sensitive key, the method comprising:
   representing or storing a reference value for the signal, wherein said reference value is continuously updated and adapted to an actual value of the signal;
   determining a difference value between the signal and the reference value, so that difference value corresponds with a change of the signal;

associating the difference value with a corresponding range of a spectrum of possible difference values, wherein:
  said spectrum is subdivided into ranges corresponding with possible causes for a change of the signal in the system;
  at least one range corresponds with temperature fluctuations;
  at least one range corresponds with noise;
  at least one range corresponds with hysteresis effects; and
  at least one range corresponds with at least one of the relevant changes in the touch sensitive key; and
identifying if the difference value results from a disturbance or from a relevant change in the electric device; wherein:
  the spectrum includes all of the possible positive and negative difference values in view of the electric device for identifying positive and negative changes of the signal; and
  each of the ranges corresponds with a certain causation of the changes of the received signal; and
recognizing the causation of said change by comparing the change of the signal with the spectrum.

9. A method for processing a signal from an electric device, wherein said method comprises the following steps:
  a detection circuit receiving the signal from the electric device and optionally modifying said signal;
  setting a reference value;
  one or more processing units thereafter:
    determining a difference value between the signal and the reference value;
    comparing the difference value with a spectrum of the possible difference values, wherein:
      said spectrum is subdivided into ranges corresponding with possible causes for a change of the signal in the system;
      at least one range corresponds with temperature fluctuations;
      at least one range corresponds with noise;
      at least one range corresponds with hysteresis effects; and
      at least one range corresponds with at least one of the relevant changes in the electronic device; and;
    associating the difference value with the corresponding range of the spectrum;
    identifying if the difference value results from a disturbance or from a relevant change in the electric device; and
    updating the reference value;
  wherein:
    each of the ranges corresponds with a certain causation of the change of the received signal; and
    by comparing the change of the signal with the spectrum by the one or more processing units the causation of said change is recognizable.

10. The method according to claim 9, wherein the received signal is an analogue signal or the received signal is a direct current voltage signal or the received signal is characterized by its voltage.

11. The method according to claim 9, wherein the signal is received from:
  a switch; or
  a touch sensitive key; or
  a variable electric or electronic element; or
  a sensor for detecting at least one physical quantity.

* * * * *

UNITED STATES PATENT AND TRADEMARK OFFICE
CERTIFICATE OF CORRECTION

PATENT NO. : 8,243,037 B2  
APPLICATION NO. : 12/667317  
DATED : August 14, 2012  
INVENTOR(S) : Rigolle et al.

Page 1 of 1

It is certified that error appears in the above-identified patent and that said Letters Patent is hereby corrected as shown below:

On the Title Page, in item (73)
Second line down, change "Zaventem" to --Brussels--

Signed and Sealed this
Twenty-eighth Day of January, 2014

Michelle K. Lee
*Deputy Director of the United States Patent and Trademark Office*